US009224724B2

(12) United States Patent
Salman et al.

(10) Patent No.: US 9,224,724 B2
(45) Date of Patent: Dec. 29, 2015

(54) MUTUAL BALLASTING MULTI-FINGER BIDIRECTIONAL ESD DEVICE

(71) Applicant: Texas Instruments Incorporated, Dallas, TX (US)

(72) Inventors: Akram A. Salman, Plano, TX (US); Farzan Farbiz, Dallas, TX (US); Ann Margaret Concannon, Palo Alto, CA (US); Gianluca Boselli, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 307 days.

(21) Appl. No.: 13/901,772

(22) Filed: May 24, 2013

(65) Prior Publication Data

US 2013/0320396 A1    Dec. 5, 2013

Related U.S. Application Data

(60) Provisional application No. 61/653,225, filed on May 30, 2012.

(51) Int. Cl.
*H01L 27/02* (2006.01)

(52) U.S. Cl.
CPC ........ *H01L 27/0248* (2013.01); *H01L 27/0259* (2013.01); *H01L 27/0266* (2013.01)

(58) Field of Classification Search
CPC ............ H01L 27/0248; H01L 27/0259; H01L 27/0266
See application file for complete search history.

(56) References Cited

U.S. PATENT DOCUMENTS

| 2008/0013231 | A1* | 1/2008 | Bazzano et al. | 361/56 |
| 2008/0232009 | A1 | 9/2008 | Ikegami | |
| 2011/0110004 | A1* | 5/2011 | Maier | 361/56 |
| 2011/0215372 | A1 | 9/2011 | Chuang | |
| 2012/0091504 | A1* | 4/2012 | Davis et al. | 257/146 |
| 2012/0307410 | A1* | 12/2012 | Yamazaki et al. | 361/88 |

FOREIGN PATENT DOCUMENTS

| JP | 2002261241 A | 9/2002 |
| JP | 2008060349 A | 3/2008 |

* cited by examiner

*Primary Examiner* — Thomas L Dickey
(74) *Attorney, Agent, or Firm* — Tuenlap D. Chan; Frank D. Cimino (57) ABSTRACT

An integrated circuit includes a bidirectional ESD device which has a plurality of parallel switch legs. Each switch leg includes a first current switch and a second current switch in a back-to-back configuration. A first current supply node of each first current switch is coupled to a first terminal of the ESD device. A second current supply node of each second current switch is coupled to a second terminal of the ESD device. A first current collection node of each first current switch is coupled to a second current collection node of the corresponding second current switch. The first current collection nodes in each first current switch is not coupled to any other first current collection node, and similarly, the second current collection node in each instance second current switch is not coupled to any other second current collection node.

18 Claims, 9 Drawing Sheets

MUTUAL BALLASTING MULTI-FINGER BIDIRECTIONAL ESD DEVICE

CROSS-REFERENCE TO RELATED APPLICATIONS

This application claims the benefit of priority under U.S.C. §119(e) of U.S. Provisional Application 61/653,225 filed May 30, 2012.

FIELD OF THE INVENTION

This invention relates to the field of integrated circuits. More particularly, this invention relates to electrostatic discharge (ESD) devices in integrated circuits.

BACKGROUND OF THE INVENTION

An electrostatic discharge (ESD) device in an integrated circuit may provide from both positive and negative voltage events. It may be desirable for the ESD device to be capable of shunting a large current in an ESD event, and also be capable of providing in a sustained ESD event without current crowding. Providing these capabilities while maintaining a desired size of the ESD device may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit includes a bidirectional ESD device which has a plurality of parallel switch legs. Each switch leg includes a first current switch coupled in series with a second current switch in a back-to-back configuration. The first current switch provides a ballast function for the second current switch in a first polarity ESD event, and the second current switch provides a ballast function for the first current switch in a second, opposite, polarity ESD event. A first current supply node of each instance of the first current switches is coupled to a first terminal of the ESD device. A second current supply node of each instance of the second current switches is coupled to a second terminal of the ESD device. A first current collection node of each instance of the first current switches is coupled to a second current collection node of each corresponding instance of the second current switches. The first current collection node of each instance of the first current switches is free of any electrical coupling to the first current collection nodes of the other instances of the first current switches, and similarly, the second current collection node of each instance of the second current switches is free of any electrical coupling to the second current collection nodes of the other instances of the second current switches.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit includes a bidirectional ESD device which has a plurality of switch legs in parallel. Each switch leg includes a first current switch coupled in series with a second current switch in a back-to-back configuration. The first current switch provides a ballast function for the second current switch in a first polarity ESD event, and the second current switch provides a ballast function for the first current switch in a second, opposite, polarity ESD event. A first current supply node of each instance of the first current switches is coupled to a first terminal of the ESD device. A second current supply node of each instance of the second current switches is coupled to a second terminal of the ESD device. A first current collection node of each instance of the first current switches is coupled to a second current collection node of each corresponding instance of the second current switches. The first current collection node of each instance of the first current switches is free of any electrical coupling to the first current collection nodes of the other instances of the first current switches, and similarly, the second current collection node of each instance of the second current switches is free of any electrical coupling to the second current collection nodes of the other instances of the second current switches.

The first current switches and/or the second current switches may be, for example, instances of a silicon controlled rectifier (SCR), a metal oxide semiconductor (MOS) transistor, and/or a bipolar transistor. The first current switches may be triggered individually by separate trigger components in each switch leg, or may be triggered by a common trigger component connected to each first current switch. Similarly, the second current switches may be triggered by separate trigger components in each switch leg, or by a common trigger component. The second current switches may be configured to trigger when a potential on the first terminal, with respect to the second terminal, rises above 30 volts. Similarly, the first current switches may be configured to trigger when the potential on the first terminal, with respect to the second terminal, drops below 30 volts. The first current switches and the second current switches may be configured to trigger at voltage magnitudes that are within 5 volts of each other. The term "voltage magnitude" is understood to refer to an absolute value of a voltage, so that a voltage magnitude is always a positive number. Alternately, the first current switches and the second current switches may be configured to trigger at voltage magnitudes that are at least 10 volts different from each other; for example, the first current switches may be configured to trigger at a voltage magnitude of 50 volts and the second current switches may be configured to trigger at a voltage magnitude of 35 volts.

Figure 1:
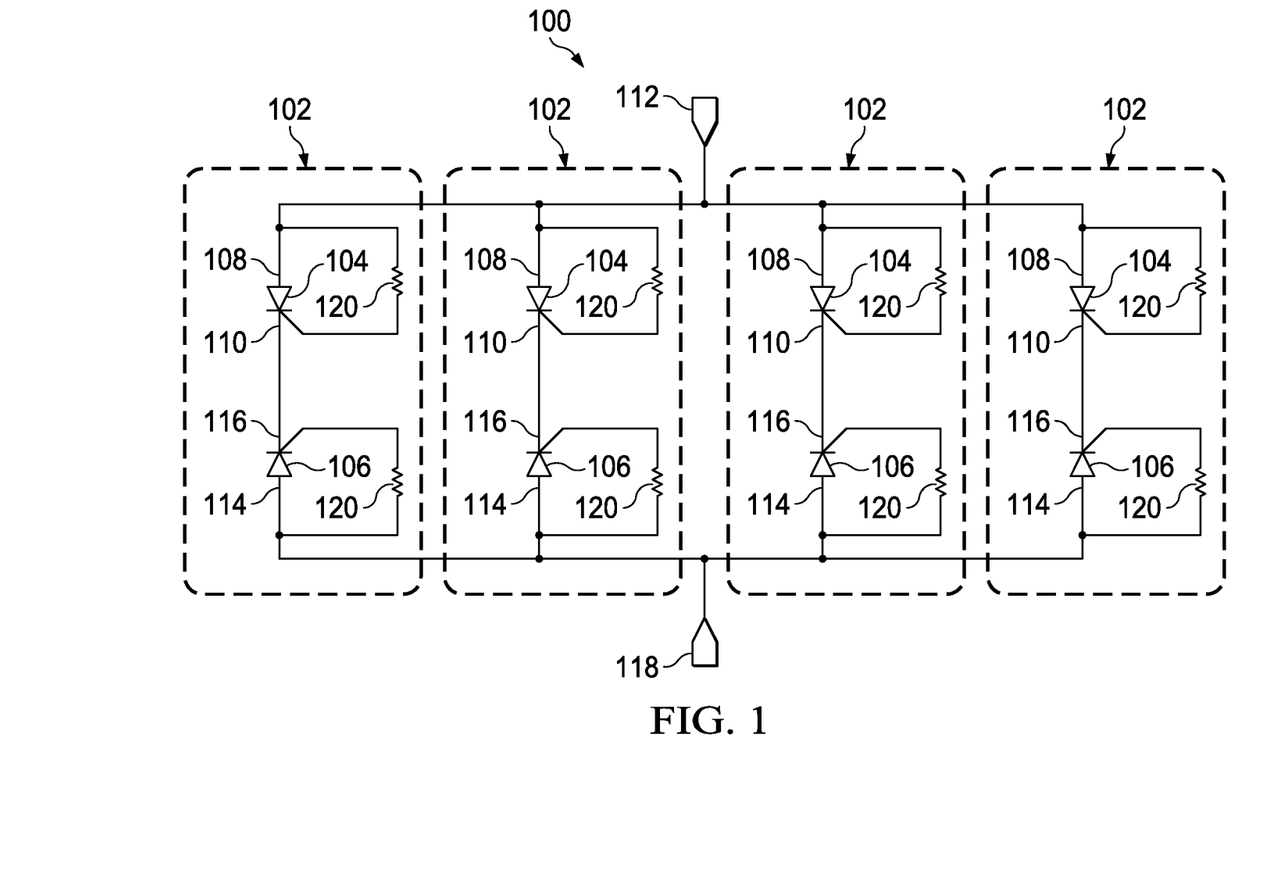
FIG. 1 through FIG. 3 are circuit schematics of exemplary bidirectional ESD devices contained in integrated circuits.
Figure 2:
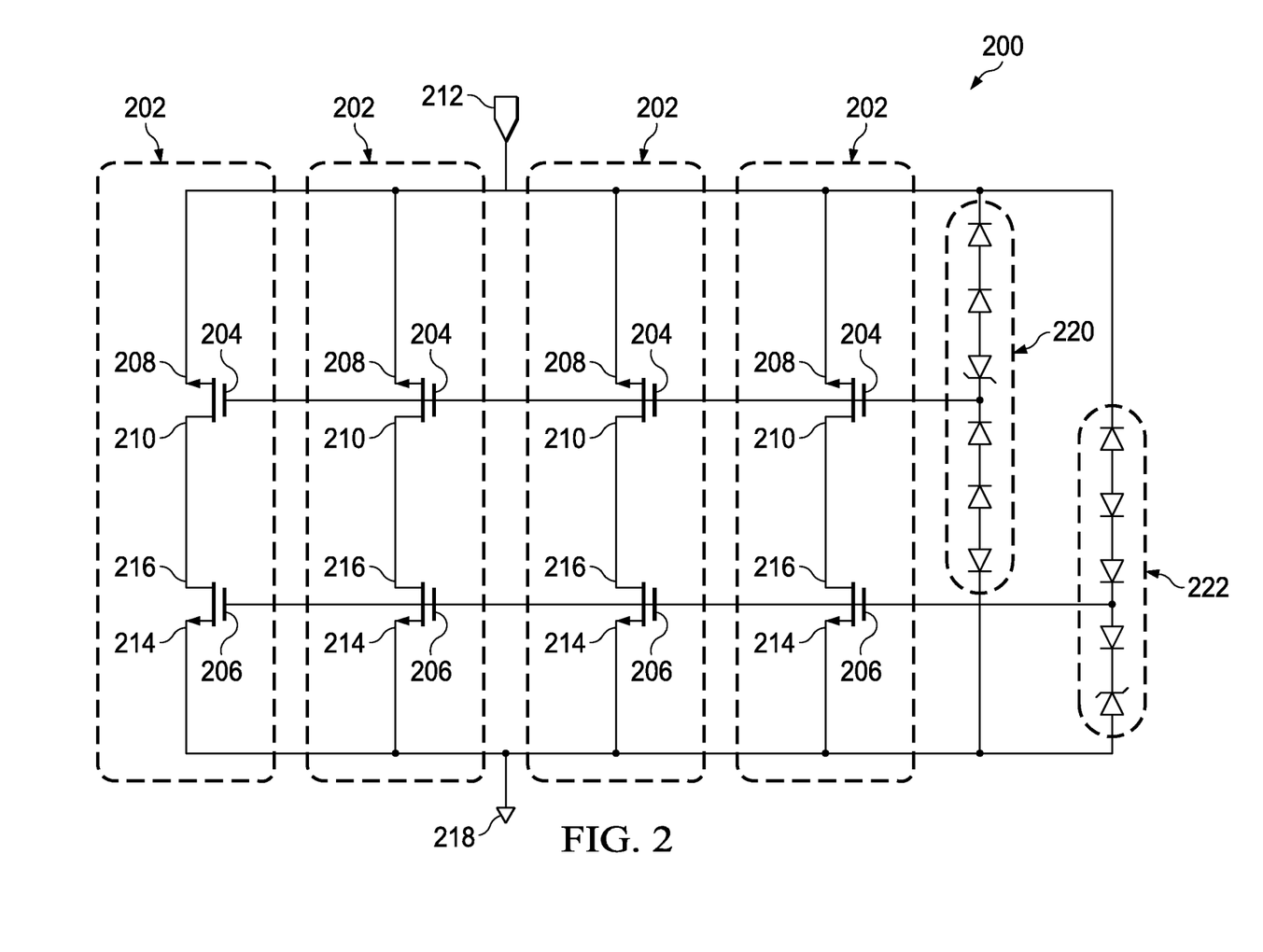
Figure 3:
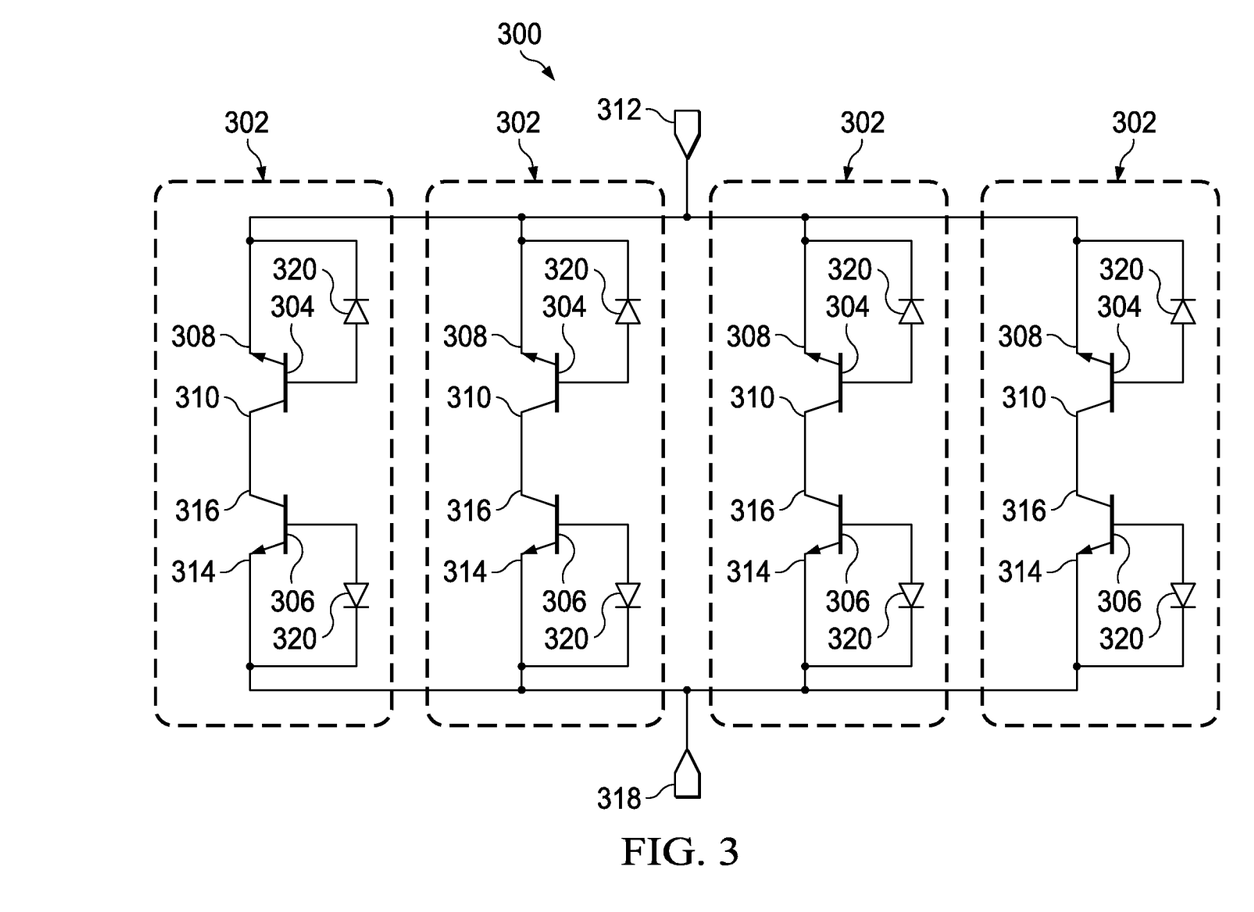

FIG. 1 through FIG. 3 are circuit schematics of exemplary bidirectional ESD devices contained in integrated circuits. Referring to FIG. 1, a bidirectional ESD device 100 includes a plurality of parallel switch legs 102. Each switch leg 102 includes a first current switch 104, which in the instant example is an SCR 104. Each switch leg 102 also includes a second current switch 106, which in the instant example is also an SCR 106, connected in series with the corresponding first current switch 104 in a back-to-back configuration.

Each first current switch 104 has a first current supply node 108 which is an anode 108 of the SCR 104, and a first current collection node 110 which is a cathode 110 of the SCR 104. Each first current supply node 108 of the first current switches 104 is coupled to a first terminal 112 of the bidirectional ESD device 100.

Similarly, each second current switch 106 has a second current supply node 114 which is an anode 114 of the SCR 106, and a second current collection node 116 which is a cathode 116 of the SCR 106. Each second current supply node 114 of the second current switches 106 is coupled to a second terminal 118 of the bidirectional ESD device 100.

Each first current collection node 110 of the first current switches 104 is coupled to the corresponding second current collection node 116 of the second current switches 106 in the same parallel switch leg 102, providing the back-to-back configuration. Each first current collection node 110 of the first current switches 104 is free of an electrical coupling to any of the other first current collection nodes 110 of the first current switches 104, and each second current collection node 116 of the second current switches 106 is free of an electrical coupling to any of the other second current collection nodes 116 of the second current switches 106.

The first current switches 104 and the second current switches 106 may be turned on by means of one or more trigger components. Each instance of the first current switches 104 and the second current switches 106 may have separate trigger components 120 as depicted in FIG. 1. Other trigger configurations are within the scope of the instant example. The first terminal 112 may be connected to an input/output terminal of the integrated circuit containing the bidirectional ESD device 100. The second terminal 118 may be connected to a ground node of the integrated circuit.

During operation of the integrated circuit, a positive polarity ESD event at the bidirectional ESD device 100 provides a voltage transient at the first terminal 112 which is positive with respect to the second terminal 118. One of the second current switches 106 may be triggered and start conducting current. The corresponding first current switch 104 in the same switch leg 102 provides ballast for the conducting second current switch 106. As the conducting second current switch 106 conducts current, a voltage drop across the conducting second current switch 106 is reduced compared to voltage drops across non-conducting instances of the second current switches 106. Because each of the second current collection nodes 116 of the second current switches 106 is free of an electrical coupling to any of the other second current collection nodes 116 of the second current switches 106, the reduced voltage drop across the conducting second current switch 106 does not reduce the voltage drops across the non-conducting of the second current switches 106, so that instances of the non-conducting second current switches 106 may be triggered and independently start conducting current.

Similarly, a negative polarity ESD event at the bidirectional ESD device 100 provides a voltage transient at the first terminal 112 which is negative with respect to the second terminal 118. One of the first current switches 104 may be triggered and start conducting current. The corresponding second current switch 106 in the same switch leg 102 provides ballast for the conducting first current switch 104. Because each of the first current collection nodes 110 of the first current switches 104 is free of an electrical coupling to any of the other first current collection nodes 110 of the first current switches 104, instances of the non-conducting first current switches 104 may be triggered and independently start conducting current.

Such a mode of operation advantageously provides for more uniform conduction by the second current switches 106 and prevents current crowding through any single instance of the second current switches 106. Thus the bidirectional ESD device 100 provides high current capacity and protection from sustained ESD events.

FIG. 2 is a circuit schematic of another exemplary bidirectional ESD device which has MOS transistors for current switches. The bidirectional ESD device 200 includes a plurality of parallel switch legs 202. Each switch leg 202 includes a first current switch 204, which in the instant example is an n-channel MOS transistor 204. Each switch leg 202 also includes a second current switch 206, which in the instant example is also an n-channel MOS transistor 206, connected in series with the corresponding first current switch 204 in a back-to-back configuration.

Each first current switch 204 has a first current supply node 208 which is a source node 208 of the n-channel MOS transistor 204, and a first current collection node 210 which is a drain node 210 of the n-channel MOS transistor 204. Each first current supply node 208 of the first current switches 204 is coupled to a first terminal 212 of the bidirectional ESD device 200. Similarly, each second current switch 206 has a second current supply node 214 which is a source node 214 of the n-channel MOS transistor 206, and a second current collection node 216 which is a drain node 216 of the n-channel MOS transistor 206. Each second current supply node 214 of the second current switches 206 is coupled to a second terminal 218 of the bidirectional ESD device 200, which in the instant example is a ground node of the integrated circuit containing the bidirectional ESD device 200.

Each first current collection node 210 of the first current switches 204 is coupled to the corresponding second current collection node 216 of the second current switches 206 in the same parallel switch leg 202, providing the back-to-back configuration. Each first current collection node 210 of the first current switches 204 is free of an electrical coupling to any of the other first current collection nodes 210 of the first current switches 204, and each second current collection node 216 of the second current switches 206 is free of an electrical coupling to any of the other second current collection nodes 216 of the second current switches 206. In the instant example, the first current switches 204 are triggered by a first trigger component 220 which is connected to all instances of gate nodes of the n-channel MOS transistors 204 of the first current switches 204. The first trigger component 220 may include Zeener diodes and one or more forward biased and reverse biased signal diodes, as depicted in FIG. 2, to provide a desired trigger level to the gates nodes of the first current switches 204. Similarly, in the instant example, the second current switches 206 are triggered by a second trigger component 222 which is connected to all instances of gate nodes of the n-channel MOS transistors 206 of the second current switches 206. The second trigger component 222 may have a structure similar to the first trigger component 220, and may be configured to trigger at a different voltage than the first trigger component 220. Other trigger configurations, for example resistor networks, are within the scope of the instant example.

During operation of the integrated circuit, a positive polarity ESD event at the bidirectional ESD device 200 causes the second trigger component 222 to apply an on state bias to the gate nodes of the n-channel MOS transistors 206 of the second current switches 206. One of the second current switches 206 turns on first and starts conducting current. The corresponding first current switch 204 in the same switch leg 202 provides ballast for the conducting second current switch 206. As the conducting second current switch 206 conducts current, a voltage drop across the conducting second current switch 206 is reduced compared to voltage drops across non-conducting instances of the second current switches 206. Because each of the second current collection nodes 216 of the second current switches 206 is free of an electrical coupling to any of the other second current collection nodes 216 of the second current switches 206, the reduced voltage drop across the conducting second current switch 206 does not reduce the voltage drops across the non-conducting of the second current switches 206, so that instances of the non-conducting second current switches 206 may turn on and independently start conducting current. Similarly, a negative polarity ESD event at the bidirectional ESD device 300 is handled, mutatis mutandis, with the same advantages as the positive polarity ESD event, providing high current capacity and protection from sustained ESD events.

FIG. 3 is a circuit schematic of another exemplary bidirectional ESD device which has bipolar transistors for current switches. The bidirectional ESD device 300 includes a plurality of parallel switch legs 302. Each switch leg 302 includes a first current switch 304, which in the instant example is an NPN bipolar transistor 304. Each switch leg 302 also includes a second current switch 306, which in the instant example is also an NPN bipolar transistor 306, connected in series with the corresponding first current switch 304 in a back-to-back configuration.

Each first current switch 304 has a first current supply node 308 which is an emitter node 308 of the NPN bipolar transistor 304, and a first current collection node 310 which is a collector node 310 of the NPN bipolar transistor 304. Each first current supply node 308 of the first current switches 304 is coupled to a first terminal 312 of the bidirectional ESD device 300. Similarly, each second current switch 306 has a second current supply node 314 which is an emitter node 314 of the NPN bipolar transistor 306, and a second current collection node 316 which is a collector node 316 of the NPN bipolar transistor 306. Each second current supply node 314 of the second current switches 306 is coupled to a second terminal 318 of the bidirectional ESD device 300, which may be a ground node of the integrated circuit containing the bidirectional ESD device 300.

Each first current collection node 310 of the first current switches 304 is coupled to the corresponding second current collection node 316 of the second current switches 306 in the same parallel switch leg 302, providing the back-to-back configuration. Each first current collection node 310 of the first current switches 304 is free of an electrical coupling to any of the other first current collection nodes 310 of the first current switches 304, and each second current collection node 316 of the second current switches 306 is free of an electrical coupling to any of the other second current collection nodes 316 of the second current switches 306. The first current switches 304 and the second current switches 306 may be turned on by means of one or more trigger components. Each instance of the first current switches 304 and the second current switches 306 may have separate trigger components 320 as depicted in FIG. 3. Other trigger configurations are within the scope of the instant example.

Operation of the integrated circuit during a positive polarity ESD event and a negative polarity ESD event at the bidirectional ESD device 300 is handled, mutatis mutandis, with the same advantages described in reference to FIG. 1 and FIG. 2, providing high current capacity and protection from sustained ESD events.

Figure 4A:
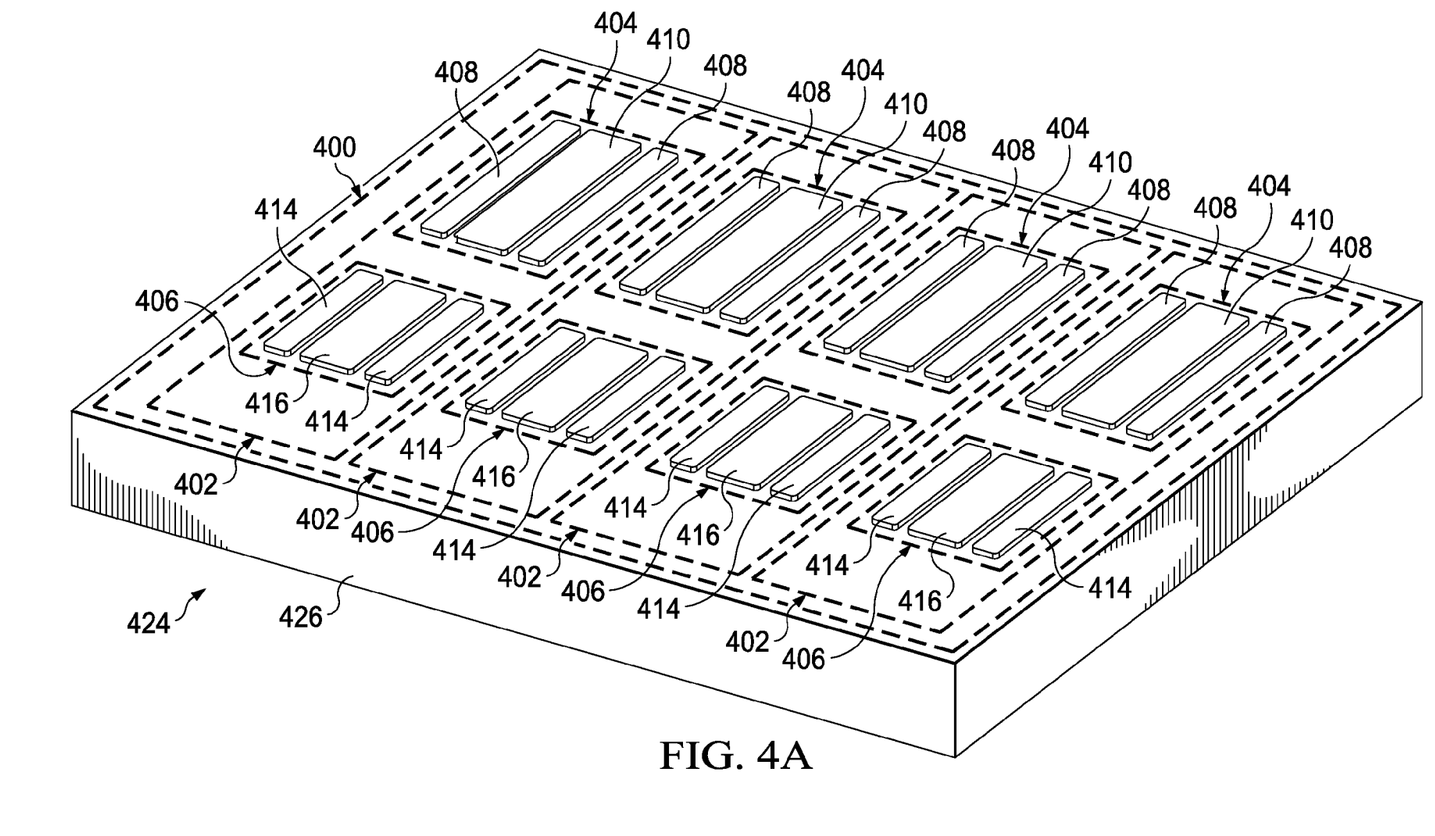
FIG. 4A through FIG. 4C are perspectives of an integrated circuit containing an exemplary bidirectional ESD device, depicted in successive stages of fabrication.
Figure 4B:
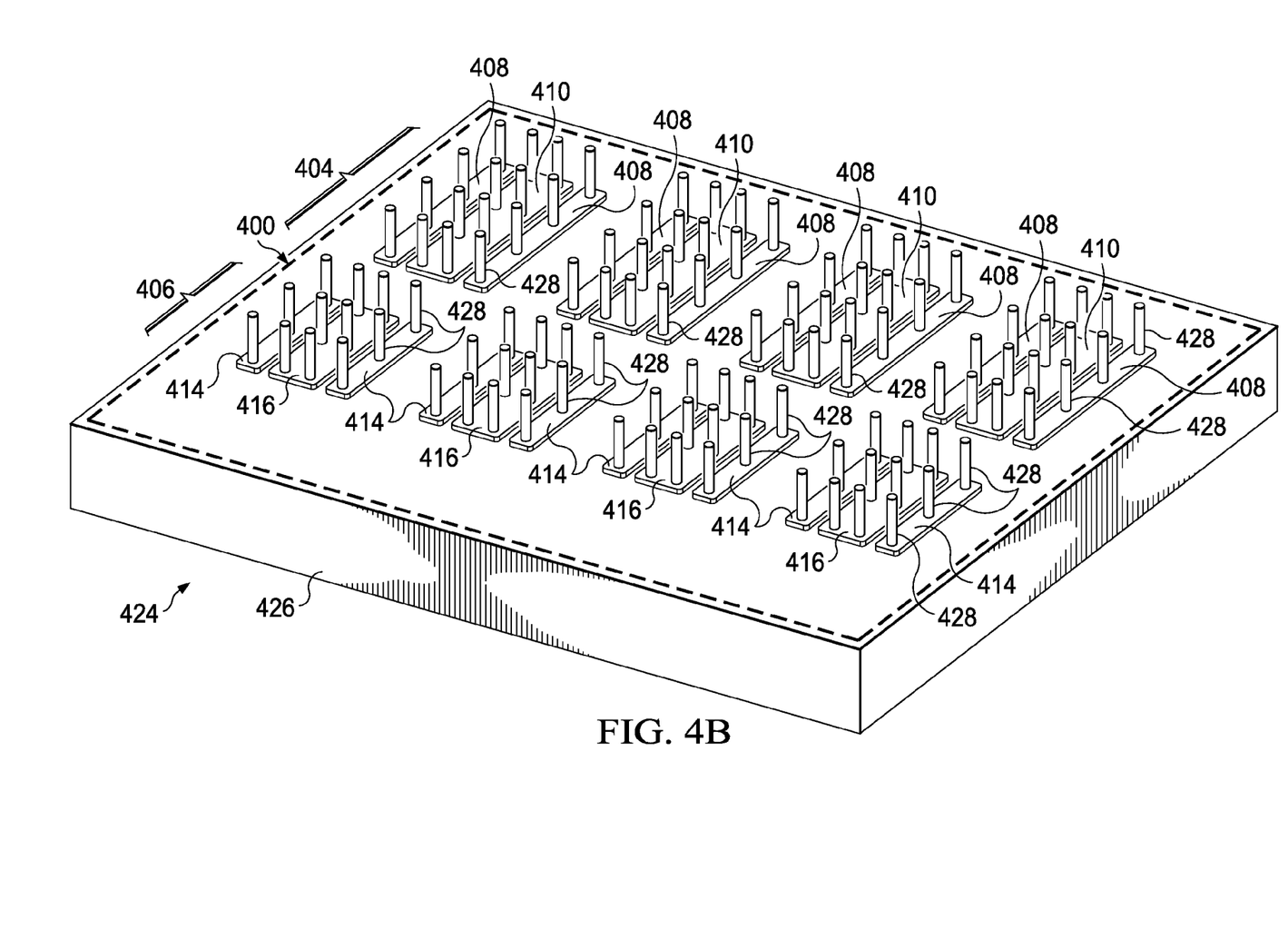
Figure 4C:
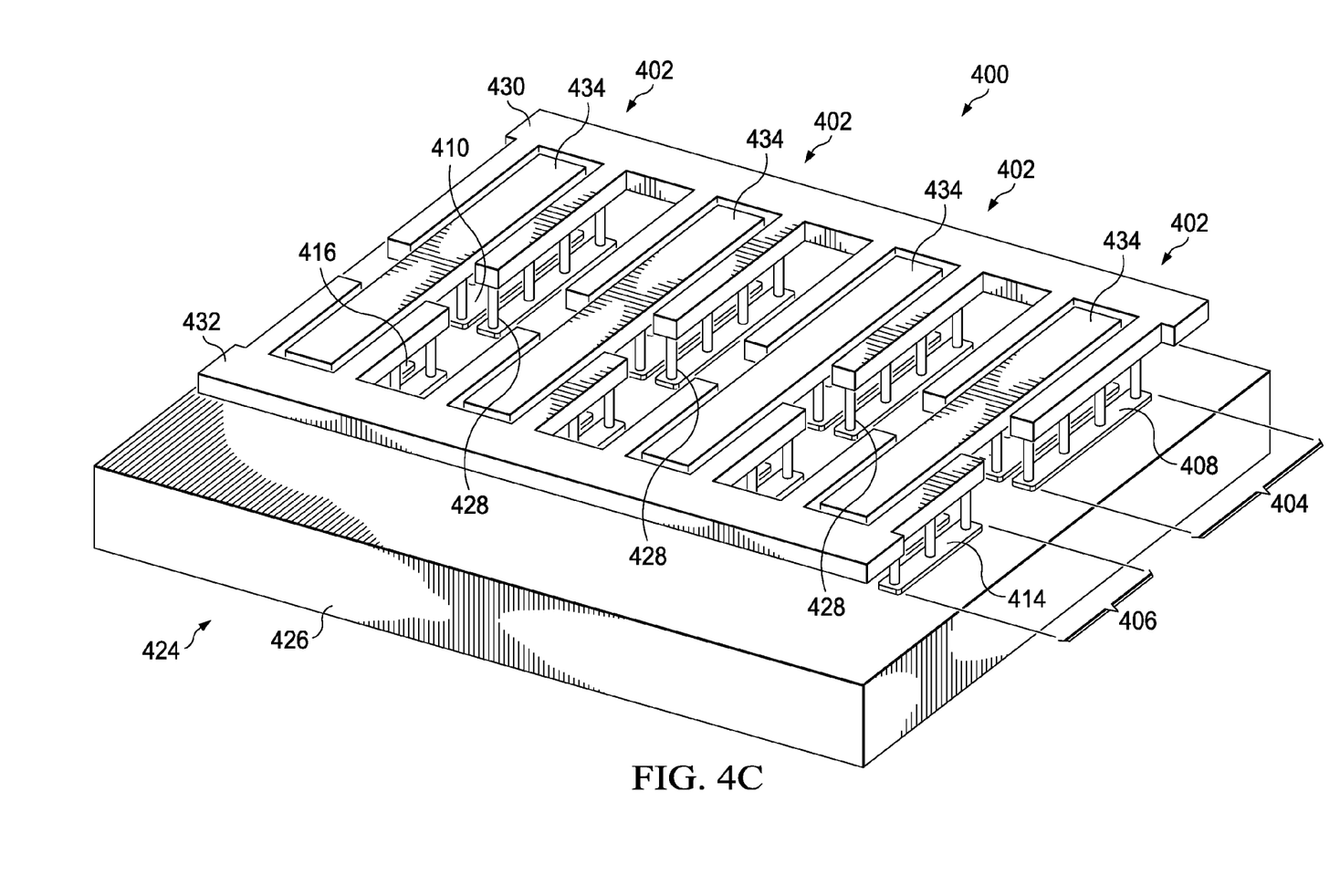

FIG. 4A through FIG. 4C are perspectives of an integrated circuit containing an exemplary bidirectional ESD device, depicted in successive stages of fabrication. Referring to FIG. 4A, the integrated circuit 424 is formed in and on a substrate 426 which includes a semiconductor material. The bidirectional ESD device 400 includes a plurality of parallel switch legs 402. Each switch leg 402 includes a first current switch 404 and a second current switch 406.

Each first current switch 404 has a first current supply node 408 and a first current collection node 410. Similarly, each second current switch 406 has a second current supply node 414 and a second current collection node 416.

Referring to FIG. 4B, contacts 428 are formed on the integrated circuit 424. The contacts 428 make electrical connections to the first current supply nodes 408 and the first current collection nodes 410 of the first current switches 404 and to the second current supply nodes 414 and the second current collection nodes 416 of the second current switches 406.

The contacts 428 may be formed through a dielectric layer, not shown in FIG. 4B, such as a pre-metal dielectric (PMD) layer of silicon dioxide and silicon nitride. The contacts 428 may be formed by etching contact holes through the PMD layer using a reactive ion etch (RIE) process, forming a liner of titanium and titanium nitride using a sputter process and an atomic layer deposition (ALD) process respectively, forming a tungsten layer on the liner using a chemical vapor deposition (CVD) process so as to fill the contact holes, and removing the tungsten and liner from a top surface of the PMD layer using etchback or chemical mechanical polish (CMP) processes.

Referring to FIG. 4C, metal interconnects are formed on the contacts 428. A first interconnect 430 of the metal interconnects makes electrical contact through the contacts 428 to the first current supply nodes 408 of the first current switches 404. The first interconnect 430 is electrically coupled to a first terminal of the bidirectional ESD device 400.

A second interconnect 432 of the metal interconnects makes electrical contact through the contacts 428 to the second current supply nodes 414 of the second current switches 406. The second interconnect 432 is electrically coupled to a second terminal of the bidirectional ESD device 400.

A plurality of current collection interconnects 434 of the metal interconnects make electrical connections to the first current collection nodes 410 of the first current switches 404 and to the second current collection nodes 416 of the second current switches 406, such that the first current collection nodes 410 of the first current switches 404 in each switch leg 402 is electrically coupled to the second current collection nodes 416 of the second current switches 406 in the same switch leg 402. Each current collection interconnect 434 is free of an electrical connection to instances of the current collection interconnects 434 in a different switch leg 402.

The metal interconnects may be formed using an aluminum metallization process, by forming a layer of adhesion metal, for example titanium tungsten or titanium nitride, on the contacts and the PMD layer, forming a layer of sputtered aluminum, for example aluminum with a few percent titanium, copper and/or silicon, on the layer of adhesion metal, and forming a layer of antireflection metal, such as titanium nitride, on the layer of sputtered aluminum. An etch mask is formed over the layer of antireflection metal so as to cover areas for the metal interconnects; the etch mask may include photoresist formed by a photolithographic process, or may include inorganic hard mask materials. An RIE process removes the layer of antireflection metal, the layer of sputtered aluminum and the layer of adhesion metal exposed by the etch mask, leaving the metal interconnects.

Alternately, the metal interconnects may be formed using a copper damascene metallization process, by forming an interlevel dielectric (ILD) layer over the contacts 428 and the PMD layer. Trenches are etched in the ILD layer, commonly between 50 and 150 nanometers deep, in regions defined for the metal interconnects. A layer of liner metal such as tantalum nitride is formed on bottoms and sides of the trenches, commonly by physical vapor deposition, atomic layer deposition or chemical vapor deposition. A seed layer of copper is formed on the liner metal, commonly by sputtering. The trenches are subsequently filled with copper, commonly by electroplating. Copper and liner metal are removed from a top surface of the ILD layer by CMP and etch processes, leaving the metal interconnects.

Additional levels of metal interconnects may be formed over the first interconnect 430, the second interconnect 432 and/or the current collection interconnects 434, to reduce a resistance of the bidirectional ESD device 400, such that each first current collection node 410 of the first current switches 404 is free of an electrical coupling to any of the other first current collection nodes 410 of the first current switches 404, and each second current collection node 416 of the second current switches 406 is free of an electrical coupling to any of the other second current collection nodes 416 of the second current switches 406.

Figure 5:
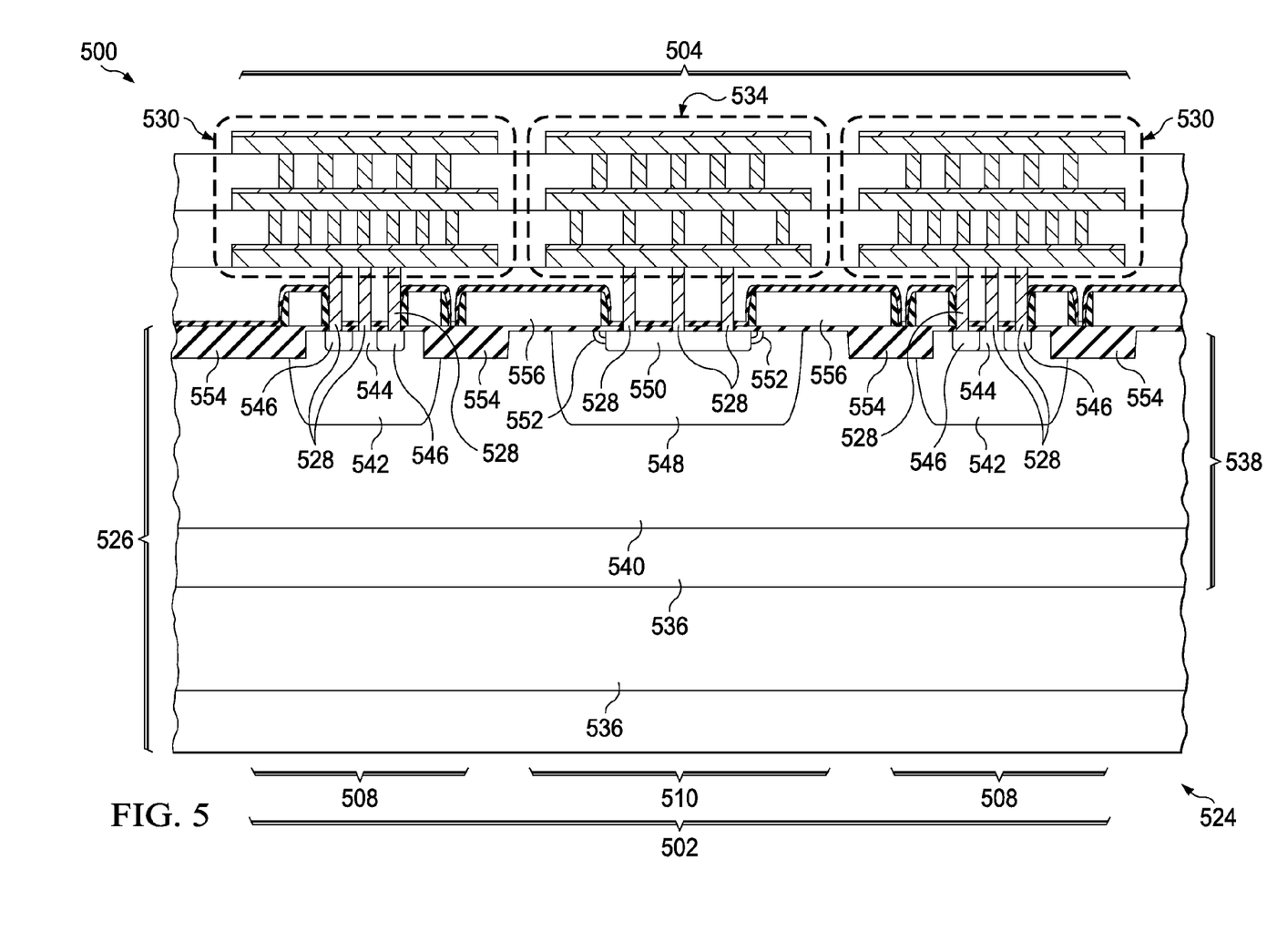
FIG. 5 is a cross section of an integrated circuit containing an exemplary bidirectional ESD device, in which first current switches and second current switches are SCRs.

FIG. 5 is a cross section of an integrated circuit containing an exemplary bidirectional ESD device, in which first current switches and second current switches are SCRs. The integrated circuit 524 is formed in and on a substrate 526 that includes a semiconductor material. FIG. 5 depicts a cross section of the bidirectional ESD device 500 through an instance of a first current switch 504, which is an SCR 504, in a switch leg 502. A second current switch of the switch leg 502 may be formed by a similar process sequence.

An n-type buried layer 536 is formed in the substrate 526, for example by implanting n-type dopants into an existing top region of the substrate 526, followed by a thermal drive and an epitaxial growth process which forms an epitaxial layer 538 of semiconductor material over the buried layer 536; the buried layer 536 extends into the epitaxial layer 538. The substrate 526 includes the buried layer 536 and the epitaxial layer. A deep n-type well 540 is formed in the substrate over the buried layer 536, for example by ion implanting n-type dopants and subsequently performing a thermal drive operation.

A first current supply node 508 of the first current switch 504, which is an anode 508 of the SCR 504, includes a shallow n-type well 542 formed in the deep n-type well 540, an n-type body contact region 544 formed in the shallow n-type well 542 and a p-type anode contact region 546 formed in the shallow n-type well 542 proximate to the n-type body contact region 544.

A first current collection node 510 of the first current switch 504, which is a cathode 510 of the SCR 504, includes a shallow p-type well 548 formed in the deep n-type well 540, an n-type cathode contact region 550 formed in the shallow p-type well 548 and p-type body contact regions 552 formed in the shallow p-type well 548 adjacent to the n-type cathode contact region 550.

Field oxide 554 may be formed at a top surface of the substrate 526 to inhibit leakage paths from the anode 508 to the cathode 510. A gate 556 is formed over the substrate 526 overlapping the deep n-type well 540 and the shallow p-type well 548; the gate 556 may be biased to trigger the SCR 504.

Contacts 528 and metal interconnects are formed over the substrate 526. A first interconnect 530 of the metal interconnects makes electrical contact through the contacts 528 to the anode 508 of the SCR 504. The first interconnect 530 is electrically coupled to a first terminal of the bidirectional ESD device 500. A current collection interconnect 534 of the metal interconnects makes electrical connection to the cathode 510 of the SCR 504 and to the second current collection node of a second current switch in the same switch leg 502. The collection interconnect 534 is free of an electrical connection to other instances of current collection interconnects in different switch legs.

Figure 6:
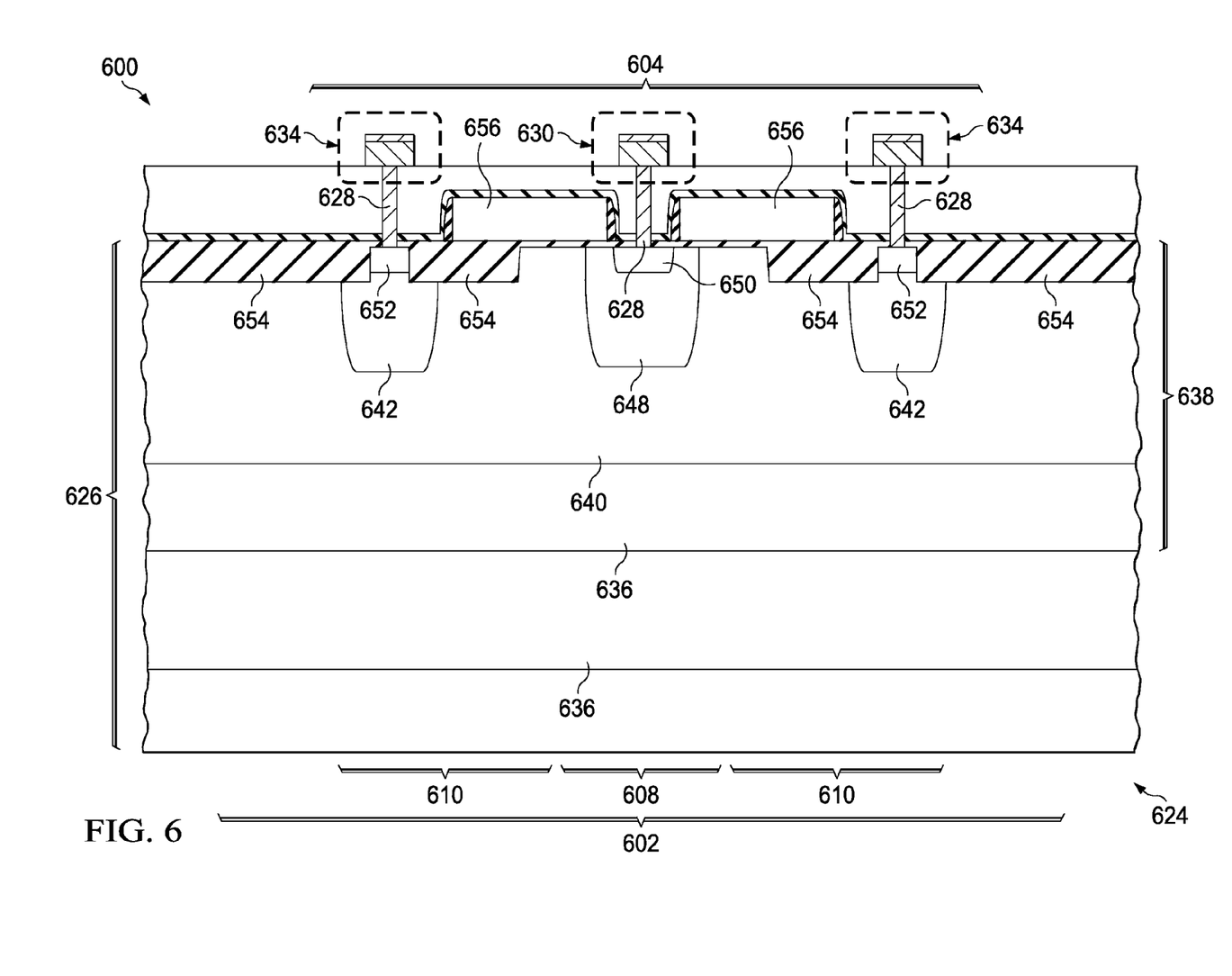
FIG. 6 is a cross section of an integrated circuit containing an exemplary bidirectional ESD device, in which first current switches and second current switches are n-channel drain extended MOS transistors.

FIG. 6 is a cross section of an integrated circuit containing an exemplary bidirectional ESD device, in which first current switches and second current switches are n-channel drain extended MOS transistors. The integrated circuit 624 is formed in and on a substrate 626 that includes a semiconductor material. FIG. 6 depicts a cross section of the bidirectional ESD device 600 through an instance of a first current switch 604, which is a drain extended MOS transistor 604, in a switch leg 602. A second current switch of the switch leg 602 may be formed by a similar process sequence.

An n-type buried layer 636 is formed in the substrate 626, and a deep n-type well 640 are formed in the substrate over the buried layer 636, for example as described in reference to FIG. 5. A first current supply node 608 of the first current switch 604, which is a source node 608 of the MOS transistor 604, includes a shallow p-type well 648 formed in the deep n-type well 640 and an n-type source region 650 formed in the shallow p-type well 648.

A first current collection node 610 of the first current switch 604, which is a drain node 610 of the MOS transistor 604, includes a shallow n-type well 642 formed in the deep n-type well 640, a portion of the a deep n-type well 640 between the shallow n-type well 642 and the shallow p-type well 648, and an n-type drain contact region 652 in the shallow n-type well 642.

Field oxide 654 may be formed at a top surface of the substrate 626 to inhibit leakage paths from the n-type drain contact regions 652 to the n-type source region 650. A gate 656 is formed over the substrate 626 overlapping the deep n-type well 640 and the shallow p-type well 648; the gate 656 may be biased to trigger the MOS transistor 604.

Contacts 628 and metal interconnects are formed over the substrate 626. A first interconnect 630 of the metal interconnects makes electrical contact through the contacts 628 to the source node 608 of the MOS transistor 604. The first interconnect 630 is electrically coupled to a first terminal of the bidirectional ESD device 600. A current collection interconnect 634 of the metal interconnects makes electrical connection to the drain node 610 of the MOS transistor 604 and to the second current collection node of a second current switch in the same switch leg 602. The collection interconnect 634 is free of an electrical connection to other instances of current collection interconnects in different switch legs.

Figure 7:
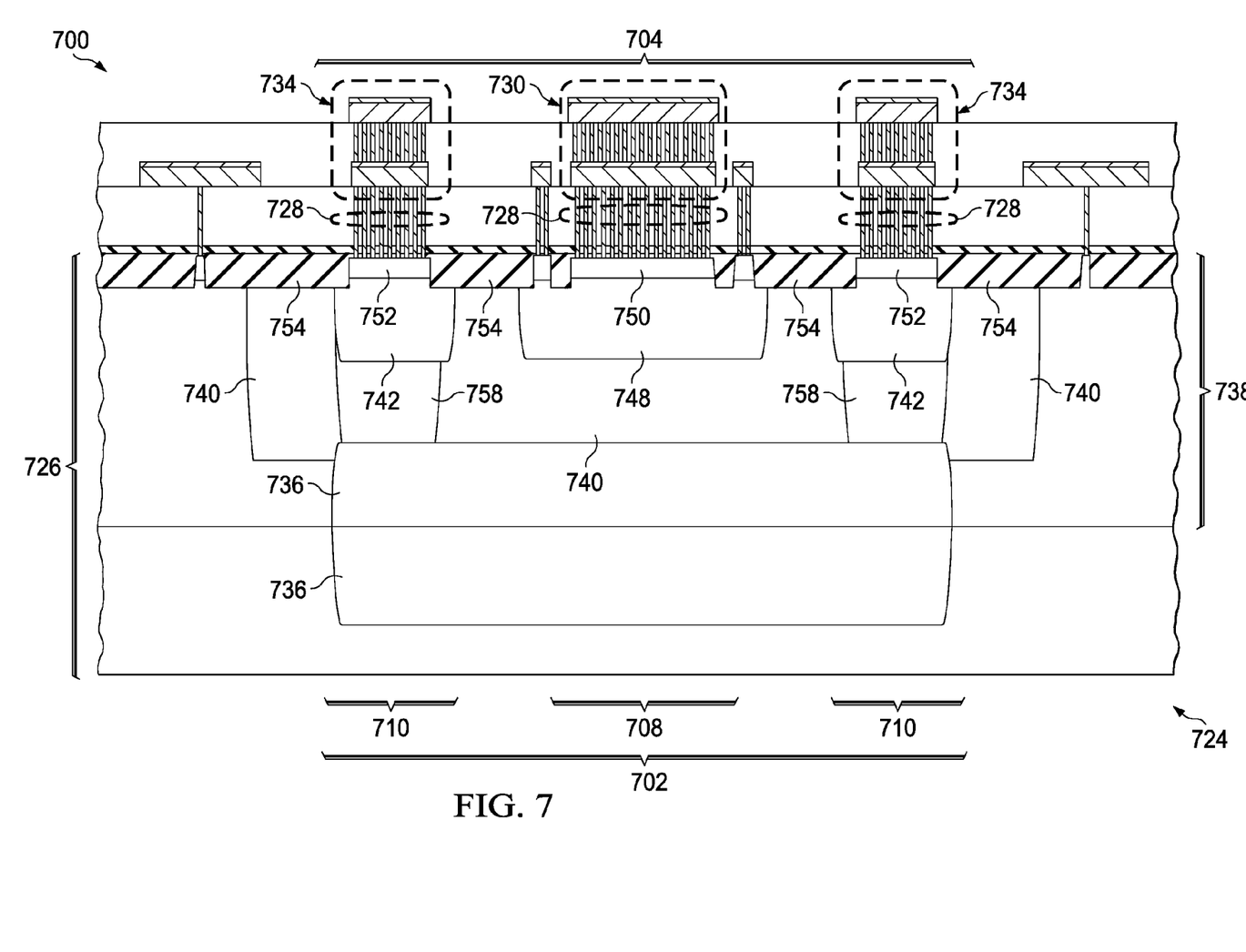
FIG. 7 is a cross section of an integrated circuit containing an exemplary bidirectional ESD device, in which first current switches and second current switches are NPN bipolar transistors.

FIG. 7 is a cross section of an integrated circuit containing an exemplary bidirectional ESD device, in which first current switches and second current switches are NPN bipolar transistors. The integrated circuit 724 is formed in and on a substrate 726 that includes a semiconductor material. FIG. 7 depicts a cross section of the bidirectional ESD device 700 through an instance of a first current switch 704, which is an NPN bipolar transistor 704, in a switch leg 702. A second current switch of the switch leg 702 may be formed by a similar process sequence.

An n-type buried layer 736 is formed in the substrate 726, for example as described in reference to FIG. 5. Deep n-type sinkers 758 are formed in the substrate 726 to make electrical connection to the buried layer 736; the deep n-type sinkers 758 may be formed, for example by implanting n-type dopants into a top region of the substrate 726, followed by a thermal drive. A deep n-type well 740 is formed in the substrate over the buried layer 736, for example as described in reference to FIG. 5. A shallow p-type well 748 which provides a base region of the bipolar transistor 704 is formed in the deep n-type well 740.

A first current supply node 708 of the first current switch 704, which is an emitter node 708 of the bipolar transistor 704, includes an n-type emitter region 750 formed in the shallow p-type well 748.

A first current collection node 710 of the first current switch 704, which is a collector node 710 of the bipolar transistor 704, includes a shallow n-type well 742 formed over the deep n-type sinkers 758 and n-type collector contact regions 752 in the shallow n-type well 742.

Field oxide 754 may be formed at a top surface of the substrate 726 to inhibit leakage paths from the n-type drain collector regions 752 to the n-type emitter region 750. Contacts 728 and metal interconnects are formed over the substrate 726. A first interconnect 730 of the metal interconnects makes electrical contact through the contacts 728 to the emitter node 708 of the bipolar transistor 704. The first interconnect 730 is electrically coupled to a first terminal of the bidirectional ESD device 700. A current collection interconnect 734 of the metal interconnects makes electrical connection to the collector node 710 of the bipolar transistor 704 and to the second current collection node of a second current switch in the same switch leg 702. The collection interconnect 734 is free of an electrical connection to other instances of current collection interconnects in different switch legs.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a substrate comprising a semiconductor material;
a bidirectional electrostatic discharge (ESD) device, comprising:
a first terminal;
a second terminal; and
a plurality of switch legs coupled in parallel between the first terminal and the second terminal, the plurality of switch legs including a first switch leg and a second switch leg, the first switch leg comprising:
a first current switch including a silicon controlled rectifier (SCR) having an anode as a first current supply node and a cathode as a first current collection node, said first current supply node being electrically coupled to said first terminal; and
a second current switch including a second current supply node and a second current collection node, said second current supply node being electrically coupled to said second terminal, and said second current collection node being coupled to said first current first current collection node of the first switch leg, said second current collection node free of electrical coupling from third and fourth current collection nodes in the second switch leg.

2. The integrated circuit of claim 1, in which:
said second current switch is a second SCR;
said second current supply node is an anode of said second SCR; and
said second current collection node is a cathode of said second SCR.

3. The integrated circuit of claim 1, in which:
said first current switch is a first metal oxide semiconductor (MOS) transistor;
said first current supply node is a source node of said first MOS transistor; and
said first current collection node is a drain node of said first MOS transistor.

4. The integrated circuit of claim 1, in which:
said second current switch is a second MOS transistor;
said second current supply node is a source node of said second MOS transistor; and
said second current collection node is a drain node of said second MOS transistor.

5. The integrated circuit of claim 1, in which:
said first current switch is a first bipolar transistor;
said first current supply node is an emitter node of said first bipolar transistor; and
said first current collection node is a collector node of said first bipolar transistor.

6. The integrated circuit of claim 1, in which:
said second current switch is a second bipolar transistor;
said second current supply node is an emitter node of said second bipolar transistor; and
said second current collection node is a collector node of said second bipolar transistor.

7. The integrated circuit of claim 1, in which said second terminal is electrically connected to a ground node of said integrated circuit.

8. The integrated circuit of claim 1, in which:
said second current switches are configured to trigger when a potential on said first terminal, with respect to said second terminal, rises above 30 volts; and
said first current switches are configured to trigger when said potential on said first terminal, with respect to said second terminal, drops below 30 volts.

9. The integrated circuit of claim 1, in which:
said second current switches are configured to trigger when a potential on said first terminal, with respect to said second terminal, rises above a first voltage magnitude; and said first current switches are configured to trigger when said potential on said first terminal, with respect to said second terminal, drops below a second voltage magnitude, said second voltage magnitude being within 5 volts of said first voltage magnitude.

10. The integrated circuit of claim 1, in which:
said second current switches are configured to trigger when a potential on said first terminal, with respect to said second terminal, rises above a first voltage magnitude; and
said first current switches are configured to trigger when said potential on said first terminal, with respect to said second terminal, drops below a second voltage magnitude, such that said second voltage magnitude differs from said first voltage magnitude by at least 10 volts.

11. The integrated circuit of claim 1, in which said first current switches are configured to trigger individually by separate trigger components in each of said switch legs.

12. The integrated circuit of claim 1, in which said first current switches are configured to trigger by a common trigger component which is connected to each of said first current switches.

13. A method of forming an integrated circuit, comprising:
providing a substrate comprising a semiconductor material;
concurrently forming a plurality of switch legs of a bidirectional ESD device, by:
forming an anode of a silicon controlled rectifier (SCR) as a first current supply node of a first current switch of each said switch leg;
forming a cathode of the SCR as a first current collection node of said first current switch of each said switch leg;
forming a second current supply node of a second current switch of each said switch leg;
forming a second current collection node of said second current switch of each said switch leg;
forming a first interconnect which electrically couples said first current supply node of each of said plurality of switch legs to a first terminal of said bidirectional ESD device;
forming a second interconnect which electrically couples said second current supply node of each of said plurality of switch legs to a second terminal of said bidirectional ESD device; and
forming a plurality of current collection interconnects, each electrically coupling said first current collection node to said corresponding second current node of said corresponding switch leg, such that each of said second current collection nodes is free of electrical coupling from other said second current collection nodes and each of said first current collection nodes is free of electrical coupling from other said first current collection nodes.

14. The method of claim 13, in which
said second current switch is a second SCR;
said second current supply node is an anode of said second SCR; and
said second current collection node is a cathode of said second SCR.

15. The method of claim 13, in which
said first current switch is a first metal oxide semiconductor (MOS) transistor;
said first current supply node is a source node of said first MOS transistor; and
said first current collection node is a drain node of said first MOS transistor.

16. The method of claim 13, in which
said second current switch is a second MOS transistor;
said second current supply node is a source node of said second MOS transistor; and
said second current collection node is a drain node of said second MOS transistor.

17. The method of claim 13, in which
said first current switch is a first bipolar transistor;
said first current supply node is an emitter node of said first bipolar transistor; and
said first current collection node is a collector node of said first bipolar transistor.

18. The method of claim 13, in which
said second current switch is a second bipolar transistor;
said second current supply node is an emitter node of said second bipolar transistor; and
said second current collection node is a collector node of said second bipolar transistor.

* * * * *